(12) United States Patent
Miyazaki

(10) Patent No.: US 9,634,708 B2
(45) Date of Patent: Apr. 25, 2017

(54) PORTABLE COMMUNICATION DEVICE WITH HOUING SEALING MEMBER

(71) Applicant: KYOCERA Corporation, Kyoto-shi, Kyoto (JP)

(72) Inventor: Hironori Miyazaki, Osaka (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 14/431,705

(22) PCT Filed: Sep. 25, 2013

(86) PCT No.: PCT/JP2013/005690
§ 371 (c)(1),
(2) Date: Mar. 26, 2015

(87) PCT Pub. No.: WO2014/050101
PCT Pub. Date: Apr. 3, 2014

(65) Prior Publication Data
US 2015/0256211 A1    Sep. 10, 2015

(30) Foreign Application Priority Data

Sep. 26, 2012    (JP) .................................. 2012-213019

(51) Int. Cl.
*H04M 1/00* (2006.01)
*H04B 1/3888* (2015.01)
(Continued)

(52) U.S. Cl.
CPC .......... *H04B 1/3888* (2013.01); *G06F 1/1626* (2013.01); *G06F 1/1656* (2013.01);
(Continued)

(58) Field of Classification Search
CPC ....................................................... H01Q 1/243
(Continued)

(56) References Cited

U.S. PATENT DOCUMENTS

| 2011/0234459 A1 | 9/2011 | Yabe |
| 2012/0062428 A1* | 3/2012 | Imano .................... H01Q 1/243 343/702 |
| 2012/0119958 A1 | 5/2012 | Uejima et al. |

FOREIGN PATENT DOCUMENTS

| JP | 07-099403 A | 4/1995 |
| JP | 2004-214443 A | 7/2004 |

(Continued)

OTHER PUBLICATIONS

International Search Report dated Oct. 29, 2013 issued in counterpart International Application No. PCT/JP2013/005690.
(Continued)

*Primary Examiner* — William D Cumming
(74) *Attorney, Agent, or Firm* — Procopio Cory Hargreaves and Savitch LLP

(57) ABSTRACT

A portable communication device includes: a housing (101); a substrate (301) disposed within the housing and including a wireless communication circuit (303); and a sealing member (401) configured to prevent entry of water into the substrate from the outside of the housing, wherein the sealing member includes an insulative base body, and an electrically conductive layer (402) covering a portion of a surface of the base body, wherein the electrically conductive layer is connected to an antenna terminal (302) of the wireless communication circuit and serves as an antenna element.

15 Claims, 11 Drawing Sheets

(51) Int. Cl.
*H01Q 1/38* (2006.01)
*H01Q 1/24* (2006.01)
*H01Q 1/44* (2006.01)
*H04M 1/18* (2006.01)
*G06F 1/16* (2006.01)
*H05K 5/06* (2006.01)
*H01Q 7/00* (2006.01)
*H04B 1/38* (2015.01)

(52) U.S. Cl.
CPC ........... *G06F 1/1698* (2013.01); *H01Q 1/243* (2013.01); *H01Q 1/38* (2013.01); *H01Q 1/44* (2013.01); *H01Q 7/00* (2013.01); *H04M 1/18* (2013.01); *H05K 5/06* (2013.01); *H04B 2001/3894* (2013.01)

(58) Field of Classification Search
USPC ........................................ 455/575.8; 343/702
See application file for complete search history.

(56) References Cited

FOREIGN PATENT DOCUMENTS

| | | |
|---|---|---|
| JP | 2006-157206 A | 6/2006 |
| JP | 2010-011241 A | 1/2010 |
| JP | 2010-124072 A | 6/2010 |
| JP | 2011-205443 A | 10/2011 |
| JP | 2012-182592 A | 9/2012 |
| JP | 2010-278750 A | 12/2012 |
| WO | 2011/007473 A1 | 1/2011 |

OTHER PUBLICATIONS

Office Action dated May 24, 2016, issued in counterpart Japanese application No. 2012-213019.

* cited by examiner

D-D cross-section

PORTABLE COMMUNICATION DEVICE WITH HOUING SEALING MEMBER

CROSS-REFERENCE TO RELATED APPLICATION

This application claims priority under 35 U.S.C. Section 119 of Japanese Patent Application No. 2012-213019 filed Sep. 26, 2012, entitled "PORTABLE COMMUNICATION DEVICE". The disclosure of the above application is incorporated herein by reference.

FIELD

Embodiments of the present disclosure relate to portable communication devices, such as portable telephone terminals and portable information terminals with a wireless communication function.

BACKGROUND

In recent years, there has been a demand for portable communication devices, such as portable telephone terminals, with improved robustness and waterproofing so that the terminals can operate under various environments and conditions according to diversified needs of users. An antenna element for a portable communication device needs to have a particular length in order to achieve a desired antenna gain. In addition, in terms of design, it is desirable that the antenna element be inside the housing without sticking out of the housing. For this configuration, it is necessary to provide a sufficient space within the housing to accommodate the antenna element, and there is concern that this space would increase the size of the housing.

SUMMARY

A portable communication device pertaining to one aspect of the present disclosure is a portable communication device comprising:
a housing;
a substrate disposed within the housing and including a wireless communication circuit;
and a sealing member configured to prevent entry of water into the substrate from the outside of the housing, wherein
the sealing member includes an insulative base body, and an electrically conductive layer covering a portion of a surface of the base body, wherein
the electrically conductive layer is connected to an antenna terminal of the wireless communication circuit and serves as an antenna element.

DESCRIPTION OF EMBODIMENTS

The following describes a portable communication device as an embodiment of the present disclosure.

Embodiment 1

Overall Structure

Figure 1:
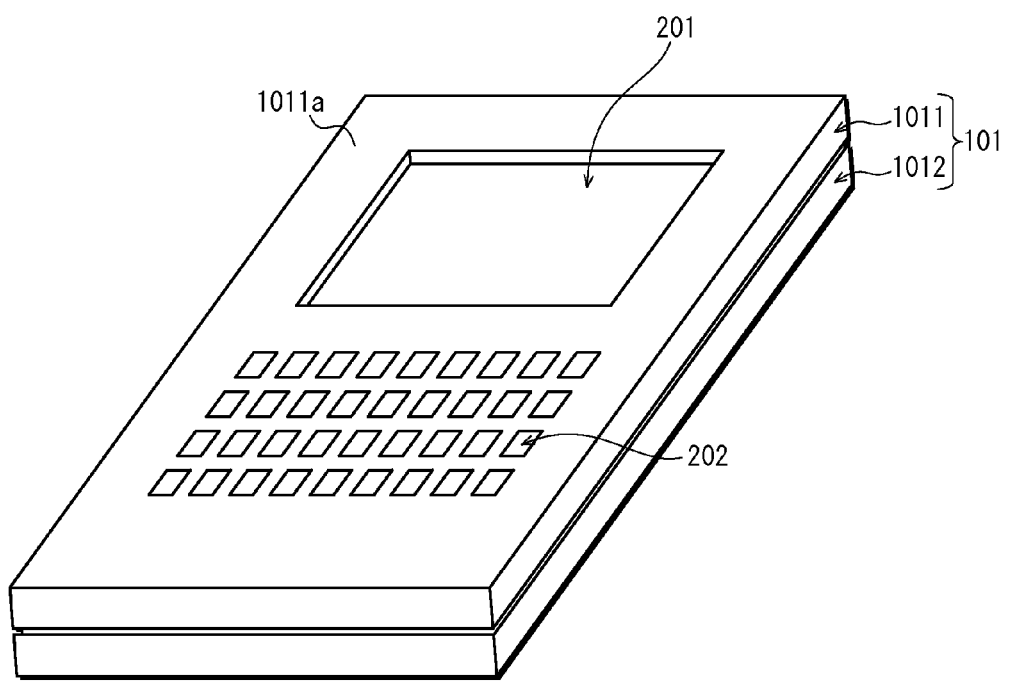
FIG. 1 is a schematic external view of an aspect of a portable communication device 100 pertaining to embodiment 1.

FIG. 1 is a schematic external view of an aspect of a portable communication device 100.

The portable communication device 100 has a plurality of wireless communication functions. The wireless communication functions include, for example, the functions of a Japanese domestic 3G mobile telephone (W-CDMA standard, 1.5 GHz and 2.1 GHz), 1seg terrestrial digital TV broadcasting, Bluetooth (registered trade mark) (Ver. 2.1, EDR (2.4 GHz, class 2)), wireless LAN (Wi-Fi (wireless fidelity)) 2.4 GHz (IEEE 802.11 b/g), GPS (1.3 GHz), and RFID (i356 MHz).

The wireless communication functions may further include, for example, the functions of a 3G mobile telephone (W-CDMA, CDMA 2000, GSM (registered trade mark) standard, 800 MHz) and a 4G mobile telephone (LTE, with forty-four frequency band classes, 700-3800 MHz).

The portable communication device 100 has a housing 101 that is composed of a first housing member 1011 made up from, for example, resin material, and a second housing member 1012 also made up from, for example, resin material, which are joined together. The portable communication device 100 has a display screen 201, which is provided on a portion of the surface of the first housing member 1011 that faces upward, i.e., a portion of the first primary surface 1011a shown in FIG. 1. The display screen 201 is, for example, a liquid crystal panel or an organic EL (electroluminescence) panel. Note that "upward" refers to the direction that is away from the first primary surface 1011a of the first housing member 1011 perpendicular to the first primary surface 1011a and "downward" refers to the opposite direction to "upward". The portable communication device 100 also has a keyboard 202 used for inputting characters, starting up a mail application, etc. A portion of the keyboard 202 is exposed from the first primary surface 1011a of the first housing member 1011. The keyboard 202 may be a so-called QWERTY keyboard, or any other type of keyboard.

Figure 2:
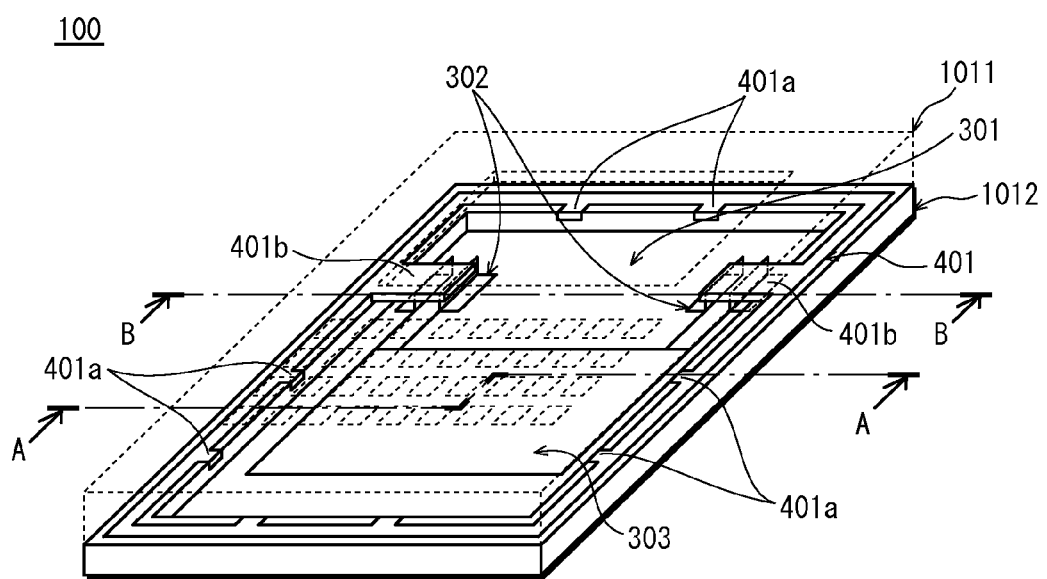
FIG. 2 is a perspective view of the portable communication device 100 pertaining to embodiment 1 seen through a first housing member 1011.
Figure 3A:
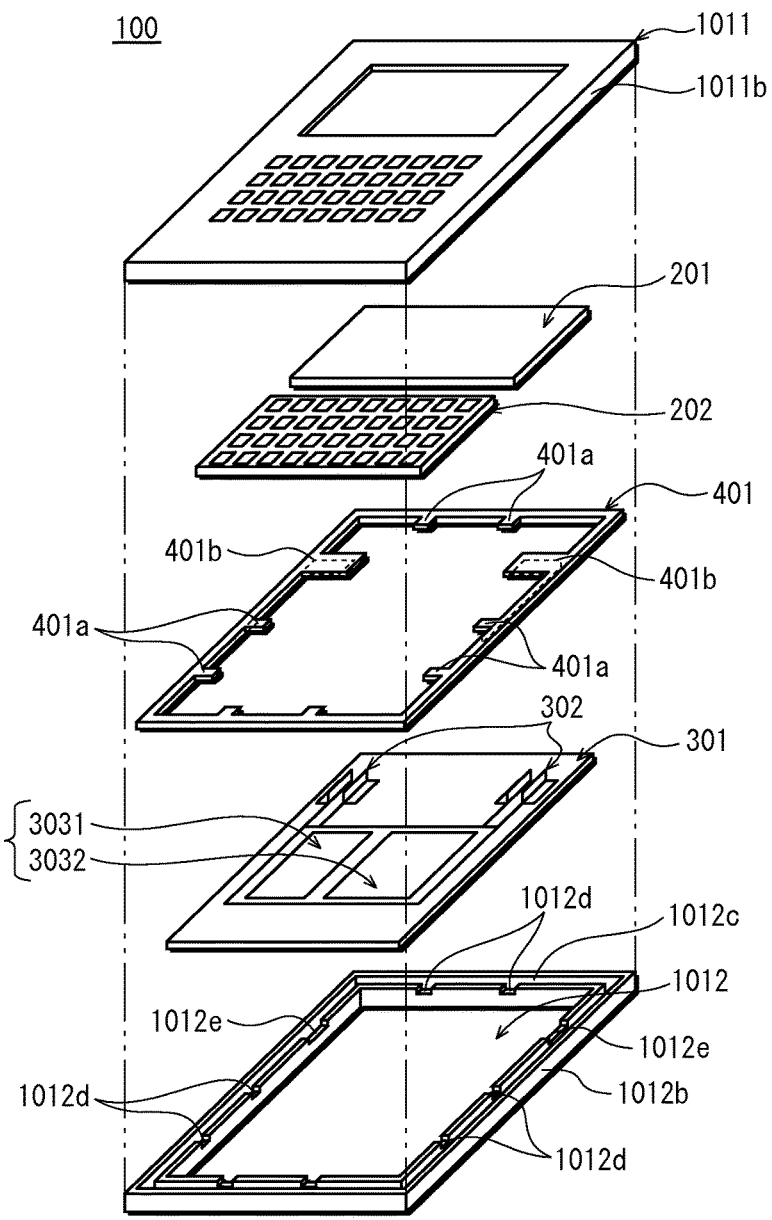
FIG. 3A is an exploded perspective view of the portable communication device 100 pertaining to embodiment 1.

FIG. 2 is a perspective view showing the inside of the housing 101 seen through the first housing member 1011. FIG. 3A is an exploded perspective view of the portable communication device 100. As shown in FIG. 2 and FIG. 3A, the first housing member 1011 and the second housing member 1012 are fastened to each other by a fastening member such as a screw or a latch which is not depicted in the drawings, so that their respective peripheral edges surrounding their respective openings face each other, with a loop-shaped flexible sealing member 401 therebetween. The housing 101 of the portable communication device 100 is configured as described above. The housing 101 houses therein a substrate 301. As described in detail below, an electrically conductive layer 402, which serves as antenna elements, is formed in a portion of the sealing member 401. The electrically conductive layer 402 is electrically connected to a wireless communication circuit 303 which is mounted on the substrate 301.

<Housing>

Figure 3B:
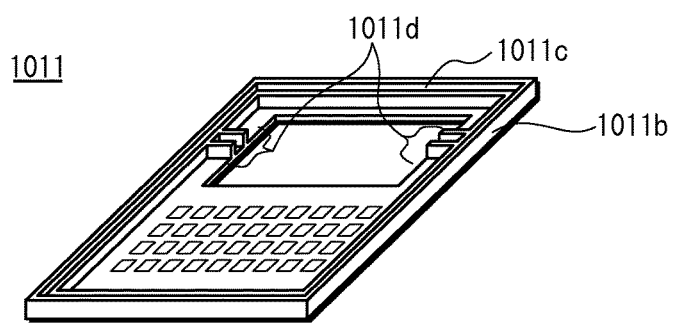
FIG. 3B is a perspective view of the first housing member 1011 seen from below.

FIG. 3B is a perspective view of the first housing member 1011 seen from below. As shown in FIG. 3A and FIG. 3B, the first housing member 1011 and the second housing member 1012 have a side wall 1011b and a side wall 1012b respectively, each of which extends along the entire periphery of the corresponding housing member. The top surfaces of the side walls 1011b and 1012b have grooves 1011c and 1012c respectively, into which portions of the sealing member 401 are to be fitted by insertion. The second housing member 1012 has a plurality of depressed portions 1012d and 1012e, which are provided on the top surface of the side wall 1012b and extend in the direction from the groove 1012c to the inside of the second housing member 1012. Into the depressed portions 1012d, a plurality of extending portions 401a and 401b of the sealing member 401 are to be loosely inserted.

A ceiling surface surrounded by the side wall 1011b of the first housing member 1011 has openings from which a portion of the display screen 201 and a portion of the keyboard 202 are to be exposed. The display screen 201 and the keyboard 202 are loosely inserted into the openings. The gap between each opening and the display screen 201 or the keyboard 202 is filled with waterproof sealing material which is not depicted in the drawings, so that no water enters the inside of the housing 101 from the gap.

A substrate 301 is disposed on the bottom surface of the second housing member 1012 where is enclosed by the side wall 1012b. The substrate 301 has antenna terminals 302, which serve as electrical contact points with the electrically conductive layer 402, and a wireless communication circuit 303, which outputs, receives, or outputs and receives, electrical signals relating to communications, to/from the electrically conductive layer 402. The wireless communication circuit 303 includes a first wireless communicator 3031 and a second wireless communicator 3032, which are different from each other. Each antenna terminal 302 is made up from, for example, an elastic metal plate, which serves as a contact point and is mounted on the substrate 301. A plurality of protrusions 1011d are provided on the rear side of the first primary surface 1011a of the first housing member 1011, at positions near the side wall 1011b, so as to face the antenna terminals 302. The antenna terminals 302 are elastic, and when the first housing member 1011 and the second housing member 1012 with the sealing member 401 therebetween are joined together, the antenna terminals 302 come into contact with the protrusions 1011d with a predetermined contact pressure such that the extending portions 401b of the sealing member 401 are sandwiched between the antenna terminals 302 and the protrusions 1011d. Due to this configuration, the antenna terminals 302 and the electrically conductive layer 402 are electrically connected. This feature is described below in detail.

<Sealing Member>

(Material and Shape of Sealing Member 401)

Figure 4:
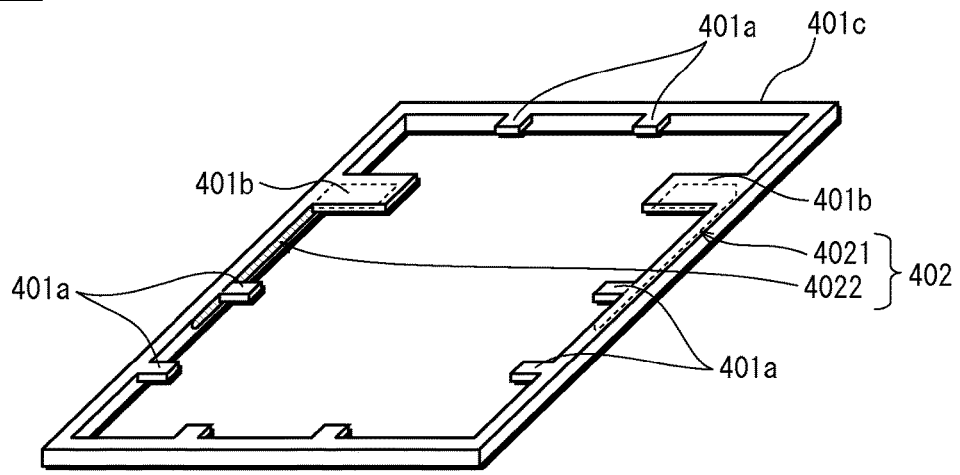
FIG. 4 is a perspective view of a sealing member 401 of the portable communication device 100 pertaining to embodiment 1, seen obliquely from above.
Figure 5:
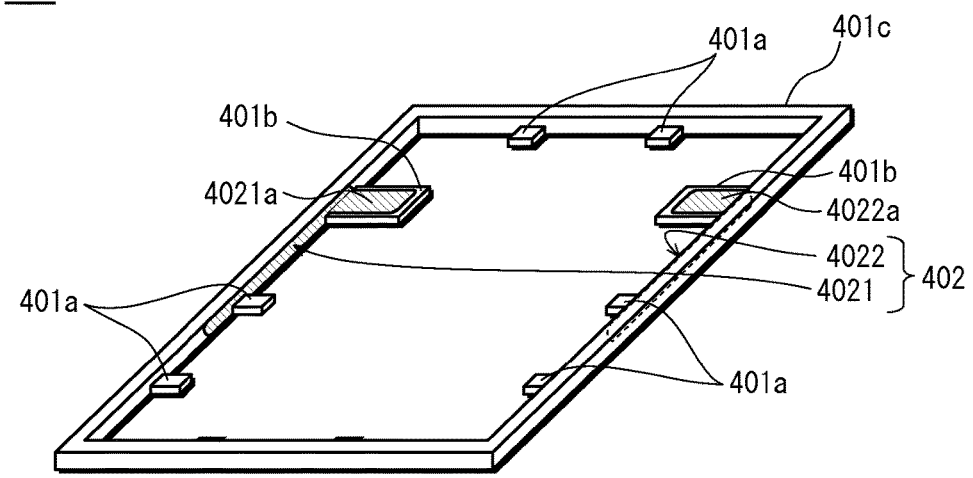
FIG. 5 is a perspective view of the sealing member 401 of the portable communication device 100 pertaining to embodiment 1, seen obliquely from below.

Next, a description is given to the sealing member 401. FIG. 4 is a perspective view of the sealing member 401 seen obliquely from above, and FIG. 5 is a perspective view of the sealing member 401 seen obliquely from below. The sealing member 401 is made up from an elastic loop-shaped body. The entire loop-shaped body of the sealing member 401 is made of a single material, and is formed as a single piece. The material is an elastic, electrically insulative resin material having excellent water-repellency, excellent resistance to chemicals, etc., such as silicone rubber. Alternatively, an electrically insulative material such as styrene-butadiene rubber (SBR), butadiene rubber (BR), ethylene-propylene rubber (EPDM), nitrile rubber (NBR), fluorine-containing rubber, or polyurethane rubber may be used. Regarding the electrical insulation of the sealing member 401, it is preferable that its volume resistivity is no less than $1 \times 10^{10}$ Ω·cm.

The sealing member 401 is to be fitted by insertion into the grooves 1011c and 1012c provided in the top surfaces of the side walls 1011b and 1012b of the first housing member 1011 and the second housing member 1012. Under such a condition, the first housing member 1011 and the second housing member 1012 are fastened to each other by a fastening member such as a screw or a latch which is not depicted in the drawings. Consequently, the sealing member 401 is tightly attached to the grooves 1011c and 1012c, and serves as a waterproof gasket.

The sealing member 401 has a plurality of extending portions 401a and 401b which extend inward from a loop-shaped portion 401c. The extending portions 401a and 401b are loosely inserted into the depressed portions 1012d and 1012e formed in the top surfaces of the side wall 1012b of the above-described second housing member 1012, thereby regulating the position of the sealing member 401 relative to the second housing member 1012.

(Configuration of Electrically Conductive Layer 402 serving as Antenna Elements)

As shown in FIG. 4 and FIG. 5, the electrically conductive layer 402, which has a thickness of 30 μm to 100 μm and serves as antenna elements, is formed on the inner surface of the loop-shaped portion 401c and on the lower surfaces of the extending portions 401b of the sealing member 401. In the present embodiment, the electrically conductive layer 402 is composed of a first electrically conductive layer 4021 and a second electrically conductive layer 4022 which serve as antenna elements for wireless communication each using a different communication scheme. As shown in FIG. 4 and FIG. 5, these layers are located on the left side and the right side of the loop-shaped portion 401c on the drawings. In the following, the portion of the first electrically conductive layer 4021 and the portion of the second electrically conductive layer 4022 formed on the extending portions 401b are respectively referred to as connecting portions 4021a and 4022a. The first electrically conductive layer 4021 and the second electrically conductive layer 4022 are connected to the first wireless communicator 3031 and the second wireless communicator 3032 included in the wireless communication circuit 303, via the connecting portions 4021a and 4022a, respectively. Each of the first wireless communicator 3031 and the second wireless communicator 3032 has a wireless communication function using a different communication scheme. Here, the different communication schemes include, for example, wireless communication involving allocation of different frequencies or different phases, wireless communication using spatial multiplexing involving allocation of different frequencies or different periods, and wireless communication involving application of different spreading codes to signals.

The length in the longitudinal direction (i.e. the antenna element length) of each of the first electrically conductive layer 4021 and the second electrically conductive layer 4022 serving as an antenna element is determined according to the wavelength relating to wireless communication performed by the antenna element. In the present embodiment, the length falls within the range of 10 mm to 60 mm. In the present embodiment, the first wireless communicator 3031 is a GPS receiver circuit (1.5 GHz band), and the second wireless communicator 3032 is a Bluetooth (registered trademark circuit (Ver. 2.1+EDR (2.4 GHz band, class 2)). Although the antenna element length of each circuit depends on the parts around the circuit, it preferably falls within the range of 10 mm to 60 mm.

The combination of a Bluetooth (registered trademark) antenna and a wireless LAN antenna (Wi-Fi antenna) may be embodied as a shared antenna, because they use the same frequency band.

The electrically conductive layers are preferably made of metal such as Au, Ag, Al, Cu, or Zn, and are formed by a known thin-film forming process such as a vapor deposition method, a sputtering method, or an ion plating method.

As described above, a single electrical connection line is formed from the first wireless communicator 3031 to the first electrically conductive layer 4021 via the antenna terminal 302 and the connecting portion 4021a. Similarly, a single electrical connection line is formed from the second wireless communicator 3032 to the second electrically conductive layer 4022 via the antenna terminal 302 and the connecting portion 4022a. With this configuration, each of the first electrically conductive layer 4021 and the second electrically conductive layer 4022 serves as a monopole antenna. Consequently, each layer can be used as an antenna element for wireless communication using a different communication scheme. Here, when forming the first electrically conductive layer 4021 and the second electrically conductive layer 4022, it is necessary to provide a region without an electrically conductive layer between the first electrically conductive layer 4021 and the second electrically conductive layer 4022 in the loop-shaped portion 401c of the sealing member 401. When forming the electrically conductive layers by a vapor deposition method or the like, it is easy to provide a region without an electrically conductive layer by patterning the deposition-target region after masking a portion of the surface of the sealing member 401.

(Waterproofing)

Figure 6:
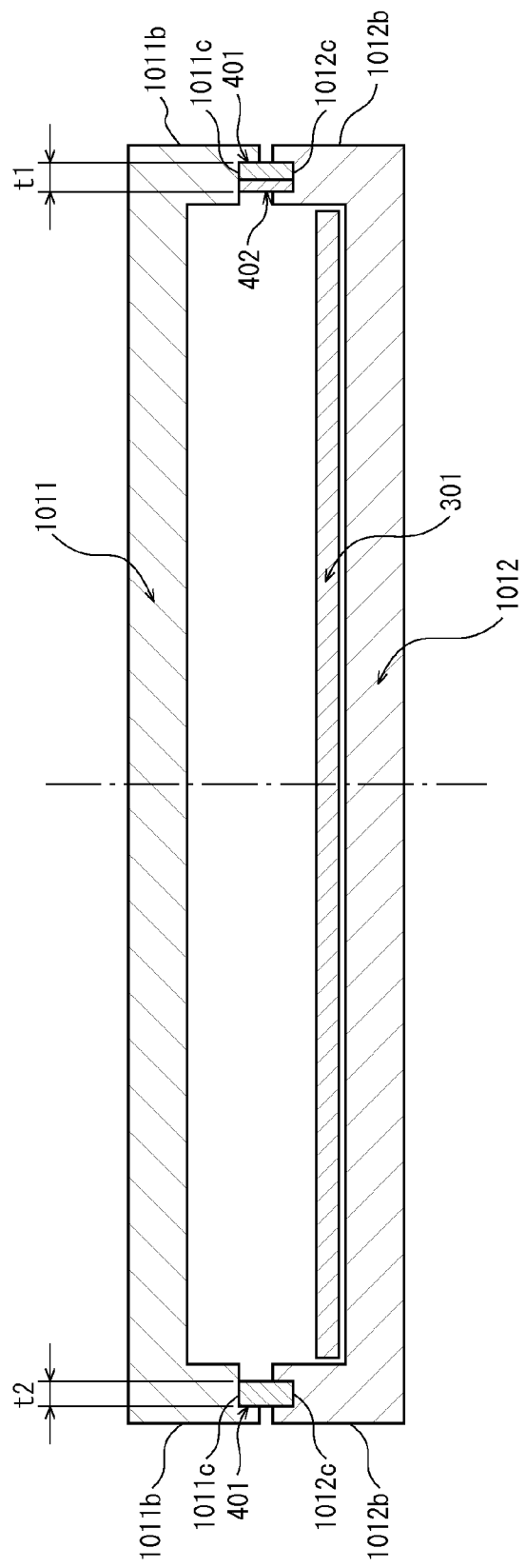
FIG. 6 is a cross-sectional view of the portable communication device 100 pertaining to embodiment 1 along the A-A line shown in FIG. 2.

FIG. 6 is a cross-sectional view along the A-A line shown in FIG. 2. The right side with respect to the central line in FIG. 6 shows a cross-section of the region of the sealing member 401 where the electrically conductive layer 402 is formed, and the left side shows a cross-section of the region of the sealing member 401 where the electrically conductive layer 402 is not formed. As described above, the sealing member 401 is fitted by insertion into the grooves 1011c and 1012c provided in the top surfaces of the side walls 1011b and 1012b of the first housing member 1011 and the second housing member 1012. Under such a condition, the first housing member 1011 and the second housing member 1012 are fastened to each other by a fastening member such as a screw or a latch which is not depicted in the drawings. Consequently, the sealing member 401 is tightly attached to the grooves 1011c and 1012c, and serves as a waterproof gasket.

The electrically conductive layers included in the electrically conductive layer 402 has a thickness of 60 μm to 80 μm. In order to tightly attach the sealing member 401 to the grooves 1011c and 1012c without a gap, the width of the groove 1011c and the groove 1012c is different in the region with the electrically conductive layer 402 and in the region without the electrically conductive layer 402. That is, the width t1 of the grooves 1011c and 1012c in the right-side portion of FIG. 6 with the electrically conductive layer 402 is greater than the width t2 of the grooves 1011c and 1012c in the left-side portion of FIG. 6 without the electrically conductive layer 402 by the thickness of the electrically conductive layer 402. This configuration achieves satisfactory waterproof properties, because no gap occurs between the sealing member 401 and the grooves 1011c and 1012c.

Preferably, the cross-section of the sealing member 401 perpendicular to the direction along the loop-shaped portion 401c has the shape of a rectangle whose long sides extend along the thickness direction of the housing 101. This is because, by reducing the width of the sealing member 401, it is possible to reduce the width of the housing 101 and thereby downsizing the housing 101 while ensuring satisfactory waterproofing.

(Antenna Functions)

In the portable communication device 100 pertaining to the present embodiment, the electrically conductive layer 402 serving as antenna elements is formed on, among the surfaces of the loop-shaped portion 401c of the sealing member 401, the surface that faces toward the inside of the housing 101, as shown in FIG. 4, FIG. 5, and FIG. 6. This is because it is preferable that the electrically conductive layer 402 is not formed on, among the surfaces of the loop-shaped portion 401c of the sealing member 401, the surface that faces toward the outside of the housing 101. In particular, it is preferable that the electrically conductive layer 402 is not formed on an area that is exposed directly to the outside of the housing 101. If the electrically conductive layer 402 is formed on an area exposed directly to the outside of the housing 101, the surface that faces toward the outside of the housing 101 among the surfaces of the loop-shaped portion 401c of the sealing member 401 would get wet when the outer surface of the housing 101 gets wet. On the other hand, it is unlikely that water reaches the surface that faces toward the inside of the housing 101 among the surfaces of the loop-shaped portion 401c of the sealing member 401, because the sealing member 401 is tightly attached to the grooves 1011c and 1012c as shown in FIG. 6. Accordingly, even if the outer surface of the housing 101 gets wet, it is unlikely that the electrically conductive layer 402 formed on the surface facing toward the inside of the housing 101 gets wet. For this reason, the above-described configuration prevents the electrically conductive layer 402 from losing the functionality thereof even when the housing 101 gets wet. The configuration also protects the electrically conductive layer 402 from corrosion by water.

(Connection Between Wireless Communication Circuit and Antenna Element)

Figure 7:
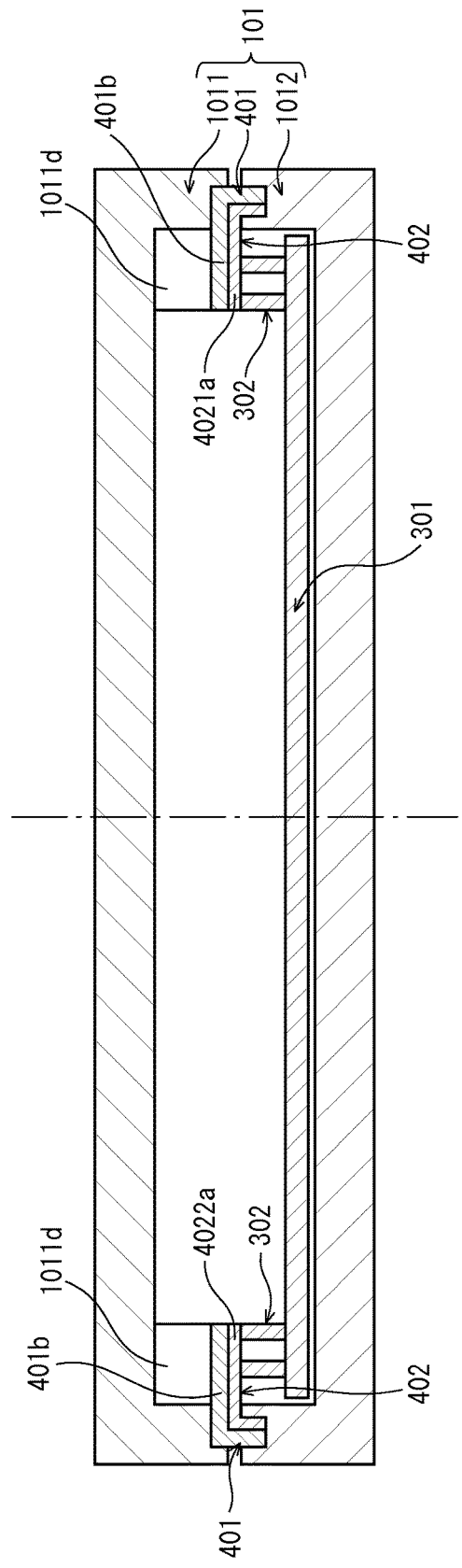
FIG. 7 is a cross-sectional view of the portable communication device 100 pertaining to embodiment 1 along the B-B line shown in FIG. 2.

FIG. 7 is a cross-sectional view along the B-B line shown in FIG. 2. The sealing member 401 has a plurality of extending portions 401b that protrude toward the inside of the housing 101 from the loop-shaped portion 401c. Either a connection portion 4021a or 4022a is provided on the lower surface of each extending portion 401b. When the first housing member 1011 and the second housing member 1012 with the sealing member 401 therebetween are joined together, the antenna terminals 302 on the substrate 301 are in contact with the protrusions 1011d formed on the lower surface of the first housing member 1011 such that the extending portions 401b, on which the connecting portion 4021a or 4022a is formed, are sandwiched between the antenna terminals 302 and the protrusions 1011d. Thus, the antenna terminals 302 come into contact with the connecting portion 4021a or 4022a with a predetermined contact pressure, and the antenna terminals 302, the wireless communication circuit 303, and the antenna elements 402 are electrically connected.

In the present embodiment, a single electrical connection line is formed from the first wireless communicator 3031 to the first electrically conductive layer 4021 via the antenna terminal 302 and the connecting portion 4021a. Similarly, a single electrical connection line is formed from the second wireless communicator 3032 to the second electrically conductive layer 4022 via the antenna terminal 302 and the connecting portion 4022a. This configuration, despite its simplicity, allows for connection between the first electrically conductive layer 4021 and the first wireless communicator 3031 and between the second electrically conductive layer 4022 and the second wireless communicator 3032, thereby enabling the first electrically conductive layer 4021 and the second electrically conductive layer 4022 to serve as monopole antenna elements.

Alternatively, the first electrically conductive layer 4021 and the second electrically conductive layer 4022 may be formed as inverted-F antenna elements, not as monopole elements. If this is the case, the electrical connections are the same as in the monopole antenna elements, but the connecting portion of one of the inverted-F antenna elements is to be connected to the GND of the substrate.

<Advantageous Effects, Etc.>

As described above, in the portable communication device 100 pertaining to embodiment 1, the sealing member 401 has a loop shape without a discontinuity. Consequently, the sealing member 401 attaches tightly to the grooves 1011c and 1012c, and serves as a waterproof gasket, achieving satisfactory waterproofing.

Furthermore, the portable communication device 100 has the electrically conductive layer 402, which is formed by a vapor deposition method, etc. on a portion of the loop-shaped portion 401c of the sealing member 401 having a loop shape. By patterning the deposition-target region, it is easy to provide a region without an electrically conductive layer on the sealing member 401 having a loop shape, thereby forming the electrically conductive layer 402 serving as antenna elements. Thus, the above-described configuration ensures excellent waterproofing and excellent functionality of the antenna elements.

<Modification 1>

Embodiment 1 of a portable wireless device pertaining to the present disclosure is described above. Note that the portable wireless device 100 may be modified as described below, and embodiments of the present disclosure are of course not limited to the portable wireless device 100 that is exactly the same as embodiment 1.

(1) The electrically conductive layer may be made up from an alloy of a metal such as Au, Ag, Al, Cu, or Zn. The electrically conductive layer may be formed by a plating method. Alternatively, the electrically conductive layer may be formed on the elastic base body by a printing method such as screen printing. Alternatively, the electrically conductive layer may be formed by bonding a metal foil, etc. to the elastic base body with an adhesive. The use of plating, printing, or bonding reduces the cost of forming the electrically conductive layer compared to the use of a vacuum process such as vapor deposition.

(2) In embodiment 1, the electrically conductive layer 402 is formed on, among the surfaces of the loop-shaped portion 401c of the sealing member 401, the surface that faces toward the inside of the housing 101. However, this configuration is not essential, and may be modified. For example, the electrically conductive layer 402 may be formed on, among the surfaces of the loop-shaped portion 401c of the sealing member 401, the surface that faces toward the outside of the housing 101 as well as on the surface that faces toward the inside of the housing 101. Alternatively, the electrically conductive layer 402 may be formed seamlessly along the surface of the loop-shaped portion 401c that faces toward the inside of the housing 101, the upper or lower surface of the loop-shaped portion 401c, and the surface that faces toward the outside of the housing 101. Furthermore, the electrically conductive layer 402 may be formed seamlessly along the surface of the loop-shaped portion 401c that faces toward the inside of the housing 101, the upper surface and the lower surface of the loop-shaped portion 401c, and the surface that faces toward the outside of the housing 101. In other words, the electrically conductive layer 402 may be formed seamlessly around the entire periphery of the cross-section of the loop-shaped portion 401c. If this is the case, the possibility of water leakage is higher at the electrically conductive layer 402, but the electrically conductive layer 402 has a larger area on the surfaces of the sealing member 401. This configuration improves the functionality of the electrically conductive layer 402 as antenna elements.

(3) In embodiment 1, a single electrical connection line is formed from the first wireless communicator 3031 to the first electrically conductive layer 4021 via the antenna terminal 302 and the connecting portion 4021a. Similarly, a single electrical connection line is formed from the second wireless communicator 3032 to the second electrically conductive layer 4022 via the antenna terminal 302 and the connecting portion 4022a. However, this configuration is not essential, and may be modified. For example, the connection of the first wireless communicator 3031 to the first electrically conductive layer 4021, and the connection of the second wireless communicator 3032 to the second electrically conductive layer 4022 are not limited to the above-described configuration. For example, the first electrically conductive layer 4021 may be formed to serve as a dipole antenna by, using a wiring pattern, forming two independent electrical connection lines from the first wireless communicator 3031 to the first electrically conductive layer 4021 via the antenna terminal 302 and the connecting portion 4021a, and arranging the two sections of the first conductive layer 4021 on the sealing member 401 to extend from the connecting portion 4021a to the opposite directions. The connection from the second wireless communicator 3032 to the second electrically conductive layer 4022 may also be configured to serve as a dipole antenna.

(4) The electrically conductive layer 402 may be configured to serve as an antenna element for wireless communications using a single communication scheme. If this is the case, a single electrically conductive layer is formed seamlessly along the loop-shaped portion 401c of the sealing member 401, thereby forming only the first electrically conductive layer 4021 as a single layer. To achieve the functionality of a monopole antenna for example, the loop-shaped portion 401c of the sealing member 401 may have a region where no electrically conductive layer is formed. When forming the electrically conductive layer by a vapor deposition method or the like, it is easy to provide a region without an electrically conductive layer by patterning the deposition-target region after masking a portion of the surface of the sealing member 401.

(5) The electrically conductive layer 402 may be configured to serve as antenna elements for wireless communications using a plurality of communication schemes that are different from each other. By patterning the deposition-target region by a vapor deposition method or the like, it is easy to form, on the loop-shaped portion 401c of the sealing member 401, the first electrically conductive layer 4021 through the $n^{th}$ electrically conductive layer 402n that serve as n types of electrically-independent antenna elements according to the number n of the communication schemes that are to be used by the antenna elements. The sealing member 401 has a plurality of extending portions 401a and 401b which extend inward from a loop-shaped portion 401c. In this way, the first electrically conductive layer 4021 through the $n^{th}$ electrically conductive layer 402n are electrically connected to the first wireless communicator 3031 through the $n^{th}$ wireless communicator 303n, respectively, via connecting portion 4021a through connecting portion 402na, respectively. The first wireless communicator 3031 through the $n^{th}$ wireless communicator 303n are different from each other, and the connecting portion 4021a through the connecting portion 402na have extending portions that are different from each other. According to this configuration, the antenna terminals 402 that are used in different communication functions are arranged efficiently on the sealing member 401. Thus, there is no need to provide space to contain multiple antennas in the housing 101, and the housing 101 can be reduced in size.

(6) A configuration is described in which the electrically conductive layer 402 is connected to the antenna terminal 302 of the wireless communication circuit 303 to function as an antenna element. However, by not connecting a portion of the electrically conductive layer 402 to the antenna terminal 302, or by connecting said portion of the electrically conductive layer 402 to a passive terminal of the wireless communication circuit 303, said portion of the electrically conductive layer 402 can function as a passive element of the wireless communication circuit 303.

Embodiment 2

Figure 8:
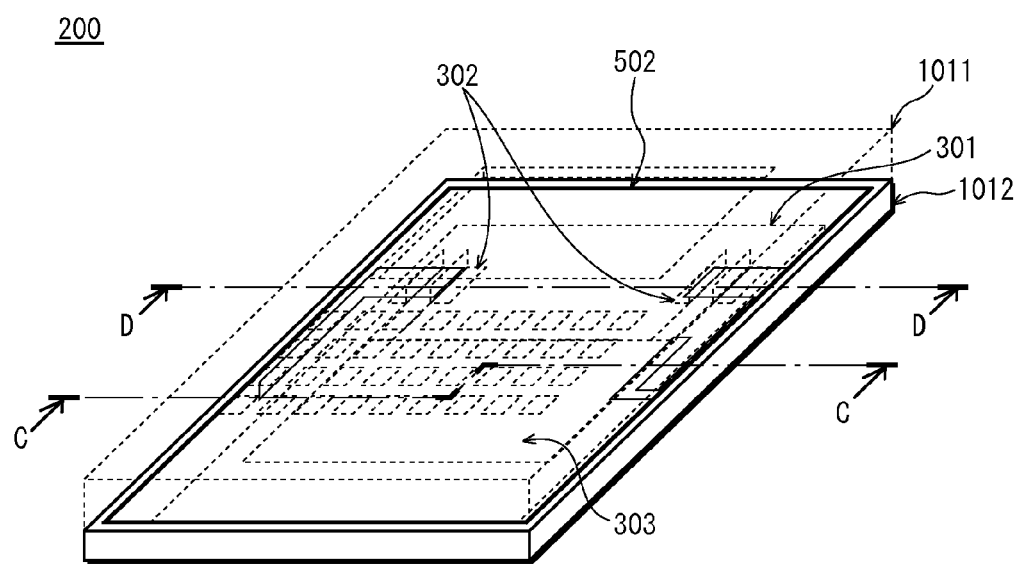
FIG. 8 is a perspective view of a portable communication device 200 pertaining to embodiment 2 seen through the first housing member 1011.
Figure 9A:
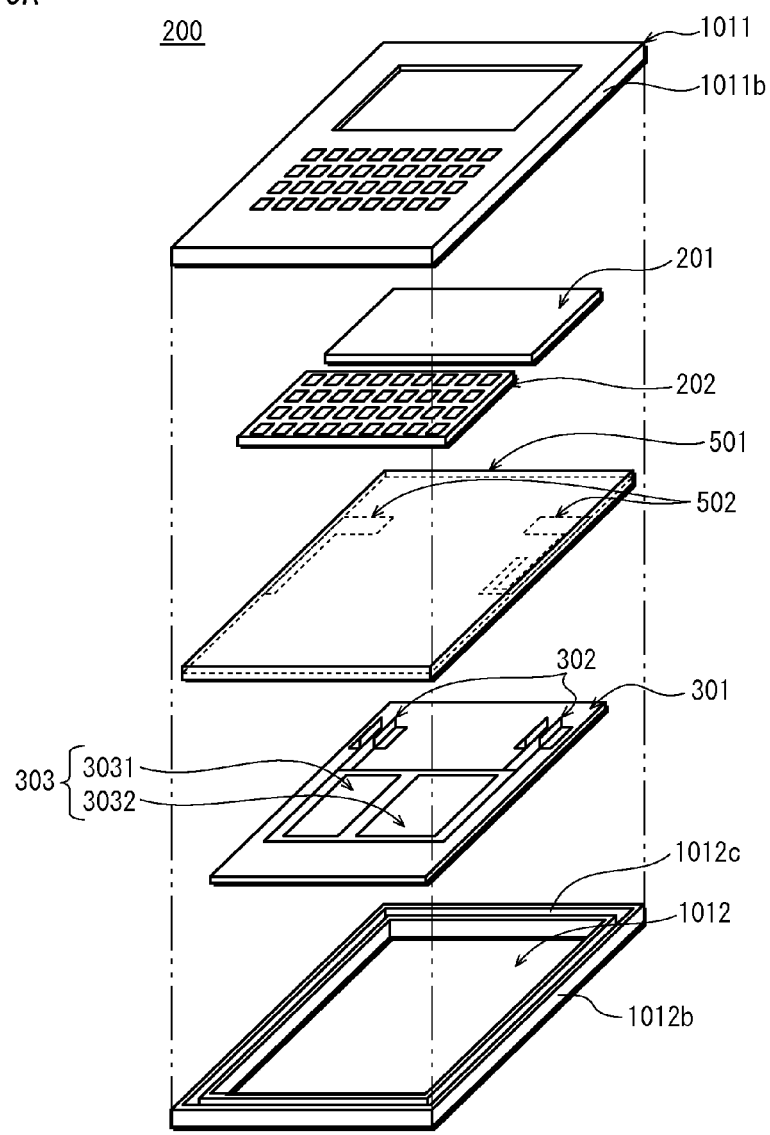
FIG. 9A is an exploded perspective view of the portable communication device 200 pertaining to embodiment 2.
Figure 9B:
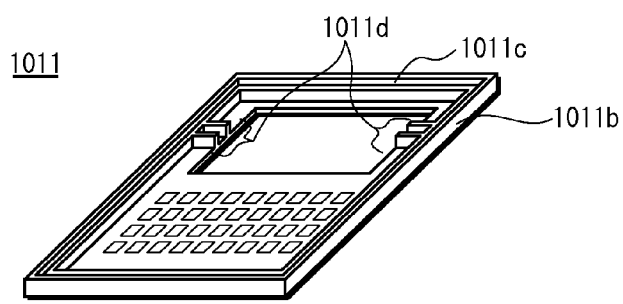
FIG. 9B is a perspective view of the first housing member 1011 seen from below.

The following describes a portable communication device 200 pertaining to embodiment 2 of the present disclosure with reference to the drawings. Note that the scale of each element of the drawings is different to actual scale.
<Overall Structure>
The portable communication device 200 pertaining to embodiment 2 of the present disclosure is characterized in that the sealing member 401 having a loop-like shape used in the portable communication device 100 pertaining to the embodiment 1 is changed to a sealing member 501 having a sheet-shape. Other elements of the portable wireless device are the same as in embodiment 1, and description thereof is omitted here.
<Housing>
FIG. 8 is a perspective view showing the inside of the housing 101 of the portable communication device 200 seen through the first housing member 1011, and FIG. 9A is an exploded perspective view of the portable communication device 200. FIG. 8B is a perspective view of the first housing member 1011 seen from below. The housing 101, the first housing member 1011, the second housing member 1012, the display screen 201, the keyboard 202, the substrate 301, the antenna terminal 302, and the wireless communication circuit 303 are the same as in embodiment 1, and description thereof is omitted here.

Figure 10:
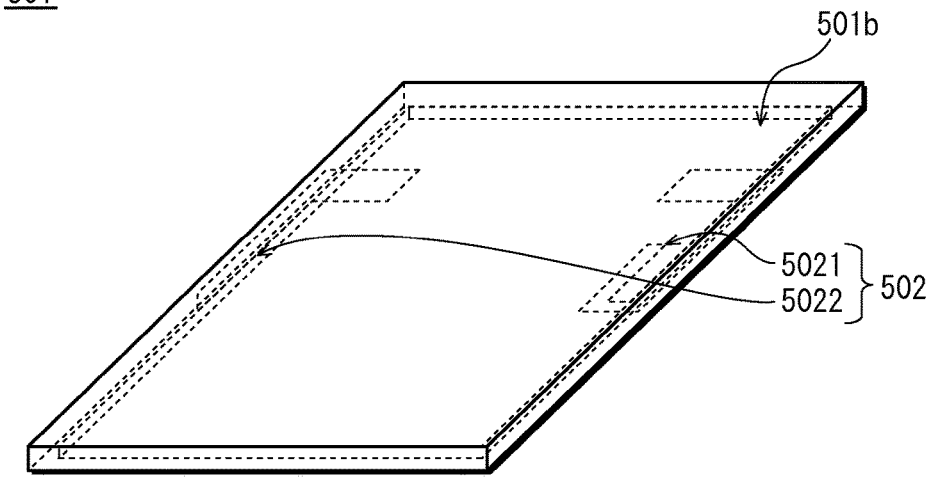
FIG. 10 is a perspective view of a sealing member 501 of the portable communication device 200 pertaining to embodiment 2, seen obliquely from above.
Figure 11:
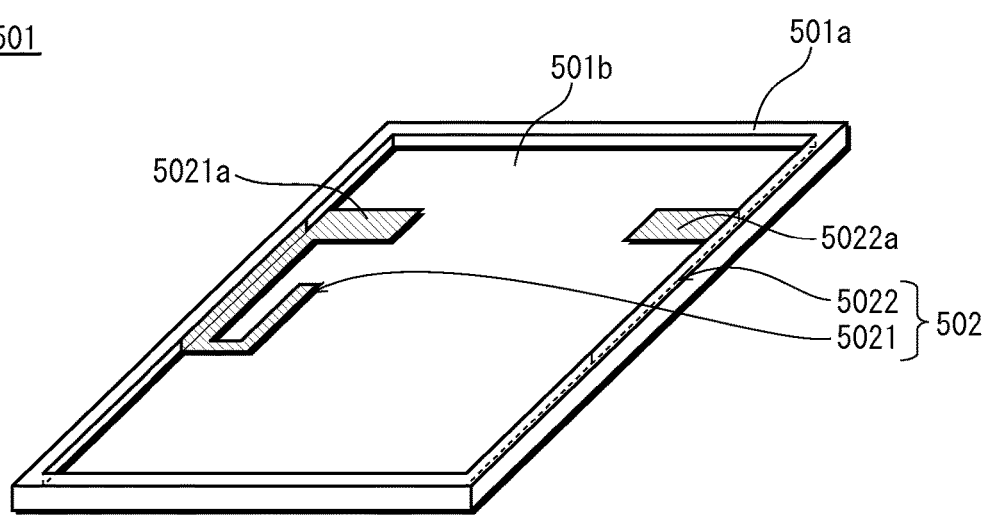
FIG. 11 is a perspective view of the sealing member 501 of the portable communication device 200 pertaining to embodiment 2, seen obliquely from below.

The portable communication device 200 pertaining to embodiment 2 of the present disclosure is, as mentioned above, characterized in that the sealing member 401 having a loop-like shape used in the portable communication device 100 pertaining to the embodiment 1 is changed to a sealing member 501 having a sheet-shape.
<Sealing Member>
(Material and Shape of Sealing Member 501)
Next, a description is given to the sealing member 501. As shown in FIG. 8 and FIG. 9A, the sealing member 501 has a sheet-shape and is arranged above the substrate 301. FIG. 10 is a perspective view of the sealing member 501 seen obliquely from above, and FIG. 11 is a perspective view of the sealing member 501 seen obliquely from below. The sealing member 501 is made up from an elastic sheet-shaped body. Material of the sealing member 501 is the same as material of the sealing member 401 used in embodiment 1, and description thereof is omitted here.

The sealing member 501 has a sealing side wall 501a having a loop-like shape that extends downwards so as to enclose a periphery of the sealing member 501. The sealing side wall 501a is to be fitted by insertion into the grooves 1011c and 1012c provided in the top surfaces of the side walls 1011b and 1012b of the first housing member 1011 and the second housing member 1012. Under such a condition, the first housing member 1011 and the second housing member 1012 are fastened to each other by a fastening member such as a screw or a latch which is not depicted in the drawings. Consequently, the sealing member 501 is tightly attached to the grooves 1011c and 1012c, and serves as a waterproof gasket.
(Configuration of Electrically Conductive Layer 502 Serving as Antenna Elements)
As shown in FIG. 10 and FIG. 11, an electrically conductive layer 502 functioning as an antenna element and having, for example, a thickness of 30 μm to 100 μm, is formed on a surface facing inwards of the loop-like shape of the sealing side wall 501a of the sealing member 501 and a lower surface of a planar portion 501b. In the present embodiment, the electrically conductive layer 502 is composed of a first electrically conductive layer 5021 and a second electrically conductive layer 5022 as in embodiment 1. As shown in FIG. 10 and FIG. 11, these layers are located on the left side and the right side of the sealing member 501 on the drawings. A connecting portion 5021a and a connecting portion 5022a that make up wide connecting portions are located at end portions in the longitudinal direction of the first electrically conductive layer 5021 and the second electrically conductive layer 5022. Via the connecting portion 5021a and the connecting portion 5022a, the first electrically conductive layer 5021 is connected to the first wireless communicator 3031 and the second electrically conductive layer 5022 is connected to the second wireless communicator 3032. The antenna terminals 302 are elastic, and when the first housing member 1011 and the second housing member 1012 with the sealing member 501 therebetween are joined together, the antenna terminals 302 come into contact with the protrusions 1011d with a predetermined contact pressure such that the planar portion 501b of the sealing member 501 having a sheet-shape are sandwiched between the antenna terminals 302 and the protrusions 1011d. Due to this configuration, the antenna terminals 302 and the electrically conductive layer 502 are electrically connected. Details of this configuration are described later.

Length in the longitudinal direction of the first electrically conductive layer 5021 and the second electrically conductive layer 5022 (antenna length) is the same as that of the first electrically conductive layer 4021 and the electrically conductive layer 4022 used in embodiment 1, and description thereof is omitted here. However, in the present embodiment, it is also possible to form an antenna having a long antenna element length such as an 800 MHz band antenna or an AWS (1700 MHz-2100 MHz) antenna that requires wide frequency characteristics across the entirety of the planar portion 501b of the sealing member 501. In such a case, the antenna element length is preferably in a range of 10 mm to 60 mm.

Material and method of construction of the electrically conductive layer is the same as that of the sealing member 401 used in embodiment 1, and description thereof is omitted here.

Note that in a case in which the electrically conductive layer 502 is formed by vacuum deposition, etc., the planar portion 501b of the sealing member 501 can be utilized as a mask to easily perform patterning of a deposition area with a high degree of freedom.

(Waterproofing)

Figure 12:
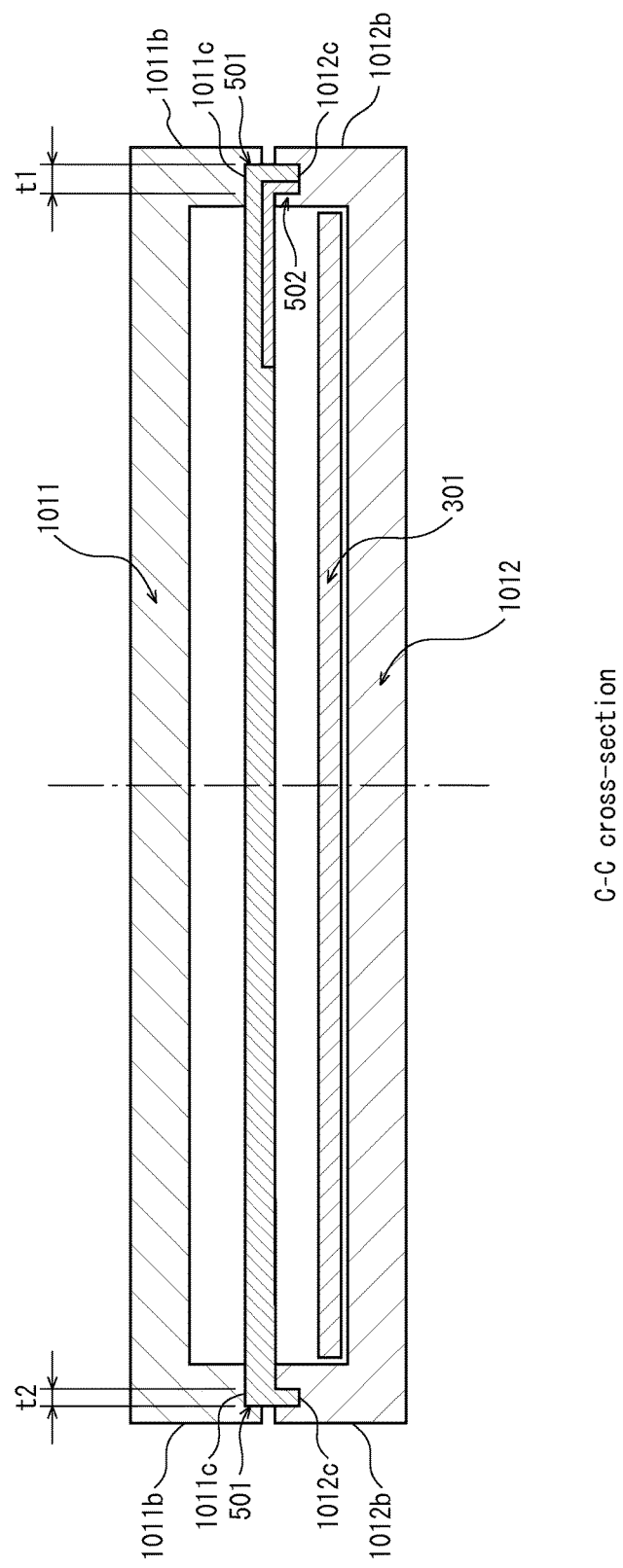
FIG. 12 is a cross-sectional view of the portable communication device 200 pertaining to embodiment 2 along the C-C line shown in FIG. 8.

FIG. 12 is a cross-sectional view along the C-C line shown in FIG. 8. The right side with respect to the central line in FIG. 12 shows a cross-section of the region of the sealing member 501 where the electrically conductive layer 502 is formed, and the left side shows a cross-section of the region of the sealing member 501 where the electrically conductive layer 502 is not formed. As described above, the sealing member 501 is fitted by insertion into the grooves 1011c and 1012c provided in the top surfaces of the side walls 1011b and 1012b of the first housing member 1011 and the second housing member 1012. Under such a condition, the first housing member 1011 and the second housing member 1012 are fastened to each other by a fastening member such as a screw or a latch which is not depicted in the drawings. Consequently, the sealing member 501 is tightly attached to the grooves 1011c and 1012c, and serves as a waterproof gasket.

Here, the sealing member 501 has a sheet-shape having the planar portion 501b, in contrast to the sealing member 401 having a loop-like shape used in embodiment 1. Thus, the sealing member 501 has a function of preventing entry of water to the substrate 301 from the openings for the display screen 201 and the keyboard 202 in the ceiling surface surrounded by the side wall 1011b of the first housing member 1011. The ceiling surface surrounded by the side wall 1011b of the first housing member 1011 has openings from which a portion of the display screen 201 and a portion of the keyboard 202 are to be exposed. The display screen 201 and the keyboard 202 are loosely inserted into the openings. The gap between each opening and the display screen 201 or the keyboard 202 is filled with waterproof sealing material which is not depicted in the drawings, so that no water enters the inside of the housing 101 from the gap during normal use. However, in cases in which external water pressure is high, the waterproof sealing material deteriorates, etc., even when water enters the housing 101 from said gaps, water in the housing 101 is prevented from penetrating as far as the substrate 301 by the sealing member 501 having a sheet-shape. In this way, further improvement in waterproofing is achieved.

Note that, in the same way as the sealing member 401 used in embodiment 1, the width t1 of the grooves 1011c and 1012c in the right-side portion of FIG. 12 with the electrically conductive layer 502 is greater than the width t2 of the grooves 1011c and 1012c in the left-side portion of FIG. 12 without the electrically conductive layer 502 by the thickness of the electrically conductive layer 502. This configuration achieves satisfactory waterproofing, because no gap occurs between the sealing member 501 and the grooves 1011c and 1012c.

(Antenna Functions)

In the portable communication device 200 pertaining to the present embodiment, as shown in FIG. 11 and FIG. 12, the electrically conductive layer 502 is formed on the surface of the sealing side wall 501a of the sealing member 501 that faces toward the inside of the housing 101 and the lower surface of the planar portion 501b of the sheet-shape. In other words, the electrically conductive layer 502 is not formed on a surface of the sealing side wall 501a of the sealing member 501 that faces toward the outside of the housing 101 or a surface facing toward the openings for the display screen 201 and the keyboard 202.

For example, if the electrically conductive layer 502 were to be formed on a surface facing toward the outside of the housing 101, if the outer housing were exposed to water, the electrically conductive layer 502 could also be exposed to said water. Further, if the electrically conductive layer 502 were to be formed on a surface facing toward the openings for the display screen 201 and the keyboard 202, the electrically conductive layer 502 could be exposed to water entering from the openings from the display screen 201 and the keyboard 202.

It is unlikely that water reaches the surface of the loop-shaped portion 501c of the sealing member 501 that faces toward the inside of the housing 101, because the sealing member 501 is tightly attached to the grooves 1011c and 1012c, as shown in FIG. 12. Further, even if water were to enter from the openings in the ceiling surface of the first housing member 1011, said water would be unlikely to get around to the lower surface of the sealing member 501 because of the planar portion 501b of the sealing member 501.

Thus, even in a case in which an outer surface of the housing 101 is exposed to water, it is unlikely that the electrically conductive layer 502 is exposed to said water. For this reason, the above-described configuration prevents the electrically conductive layer 502 from losing the functionality thereof even when the housing 101 gets wet. The configuration also protects the electrically conductive layer 502 from corrosion by water.

(Connection Between Wireless Communication Circuit and Antenna Element)

Figure 13:
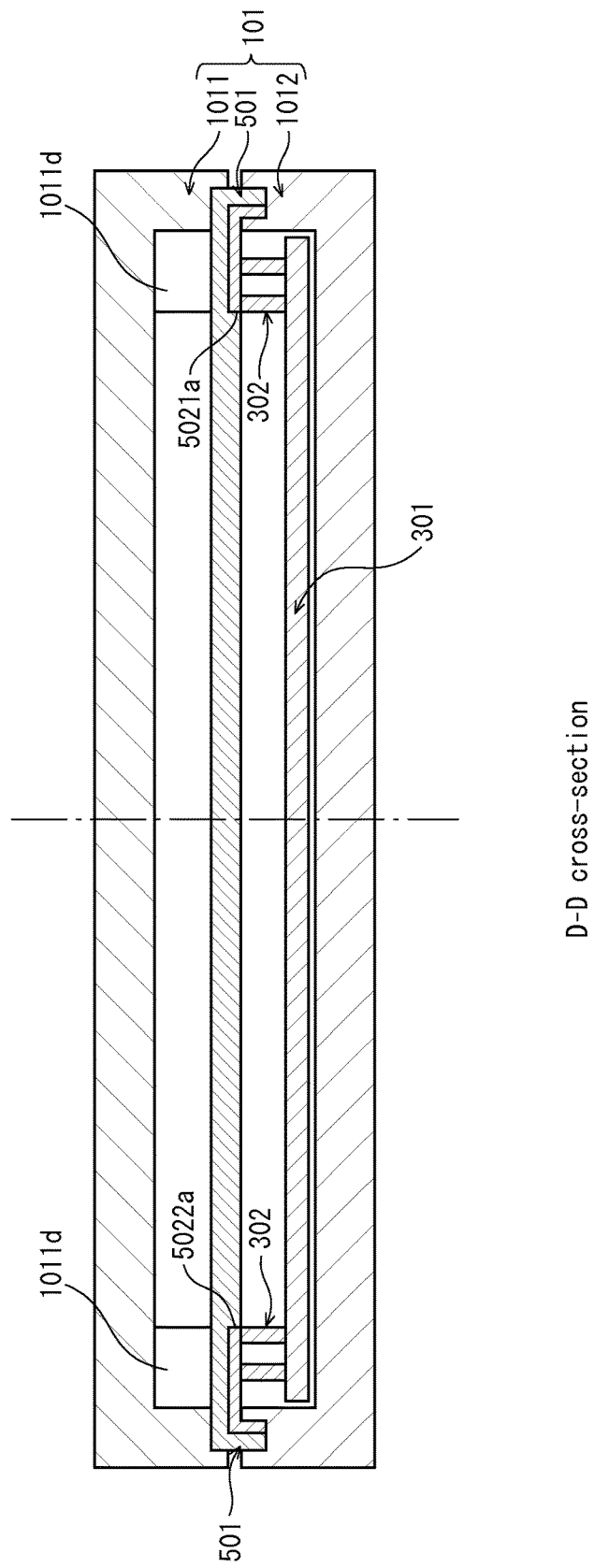
FIG. 13 is a cross-sectional view of the portable communication device 200 pertaining to embodiment 2 along the D-D line shown in FIG. 8.

FIG. 13 is a cross-sectional view along the D-D line shown in FIG. 8. The sealing member 501 is provided with either a connecting portion 5021a or a connecting portion 5022a on the lower surface of the planar portion 501b. When the first housing member 1011 and the second housing member 1012 with the sealing member 501 therebetween are joined together, the antenna terminals 302 on the substrate 301 are in contact with the protrusions 1011d formed on the lower surface of the first housing member 1011 such that the planar portion 501b, on which the connecting portion 5021a or 5022a is formed, is sandwiched between the antenna terminals 302 and the protrusions 1011d. Thus, the antenna terminals 302 come into contact with the connecting portion 5021a or 5022a with a predetermined contact pressure, and the antenna terminals 302, the wireless communication circuit 303, and the antenna elements 502 are electrically connected.

<Advantageous Effects, Etc.>

As described above, in the portable communication device 200 pertaining to embodiment 2, the sealing member 501 attaches tightly to the grooves 1011c and 1012c and serves as a waterproof gasket, achieving satisfactory waterproofing in the same way as in embodiment 1. Further, the sealing member 501 has a sheet-shape having the planar portion 501b, in contrast to the sealing member 401 having a loop-like shape used in embodiment 1. Thus, even when water enters the housing 101 from the openings in the ceiling surface of the first housing member 1011 for the display screen 201 and the keyboard 202, said water is prevented from penetrating as far as the substrate 301. In this way, further improvement in waterproofing is achieved.

Furthermore, in a case in which the electrically conductive layer 502 is formed by vacuum deposition, etc., a portion of the planar portion 501b of the sealing member 501 can be masked to easily perform patterning of a deposition area with a high degree of freedom. Thus, the housing 101 can be reduced in size because the antenna element can be freely formed due to the sealing member.

Further, the electrically conductive layer 502 is arranged on the surface of the sealing side wall 501a of the sealing member 501 facing toward the inside of the housing 101 and the lower surface of the planar portion 501b. In other words, the sealing member 501 is arranged facing the substrate 301 in a state in which, among spaces within the housing 101 delineated by the sealing member 501, the sealing member 501 faces the electrically conductive layer 502 in a space in which the substrate 301 is present. For this reason, the above-described configuration prevents the electrically conductive layer 502 from losing the functionality thereof even when the housing 101 gets wet. The configuration also protects the electrically conductive layer 502 from corrosion by water.

<Modification 2>

Embodiment 2 of a portable wireless device pertaining to the present disclosure is described above. Note that the portable wireless device 200 may be modified as described below, and embodiments of the present disclosure are of course not limited to the portable wireless device 200 that is exactly the same as described in the preceding embodiments.

(1) The electrically conductive layer 502 may be configured to serve as antenna elements for wireless communications using a plurality of communication schemes that are different from each other, in the same way as the electrically conductive layer 402 described in embodiment 1. On the loop-shaped portion 501c of the sealing member 501, the first electrically conductive layer 5021 through the $n^{th}$ electrically conductive layer 502n serve as n types of electrically-independent antenna elements according to the number n of the communication functions that serve as antenna elements. When forming the electrically conductive layers by a vapor deposition method or the like, it is easy to provide electrically conductive layers composed from a plurality of deposition-target regions by patterning the deposition-target regions after masking a portion of the surface of the sealing member 501. The planar portion 501b of the sealing member 501 having a sheet-shape can be utilized to perform patterning with a high degree of freedom. At such time, when the first electrically conductive layer 5021 through the $n^{th}$ electrically conductive layer 502n are formed on the loop-shaped portion 501c of the sealing member 501, each antenna element can be electrically connected to the first wireless communicator 3031 through the $n^{th}$ wireless communicator 303n, respectively, via the connecting portion 5021a through the connecting portion 502na, respectively. The first electrically conductive layer 5021 through the $n^{th}$ electrically conductive layer 502n serve as n types of electrically-independent antenna elements according to the number n of the communication functions that serve as antenna elements. The connecting portion 5021a through the connecting portion 502na are provided on a one-for-one basis to the antenna elements. The first wireless communicator 3031 through the $n^{th}$ wireless communicator 303n are different from each other, included in the wireless communication circuit 303, and on the substrate 301.

(2) Further, instead of the sealing member 401 composed of a loop-like structure used in the portable communication device 100 pertaining to embodiment 1, the sealing member 501 having a sheet-shape is used. However, a configuration using the portable communication device 100 pertaining to embodiment 1 may use the sealing member 501 having a sheet-shape in addition to the sealing member 401 having a loop-like shape. In such a case, the sealing member 401 and the sealing side wall 501a of the sealing member 501 are both to be fitted by insertion into the grooves 1011c and 1012c provided in the top surfaces of the side walls 1011b and 1012b of the first housing member 1011 and the second housing member 1012. In this way, in addition to achieving further improved waterproofing, the antenna elements are arranged on two types of differing sealing members and therefore the antenna elements corresponding to a plurality of communication functions can be arranged within the limited space in the housing 101 with a greater degree of freedom.

<<Supplement>>

The embodiments described above each illustrate one preferred embodiment of the present disclosure. The numerical values, shapes, materials, elements, positions and connections of said elements, processes, process orders, etc., indicated in the embodiments are examples and embodiments of the present disclosure are not limited to such examples. Further, among the elements described in the embodiments, processes not recited in independent claims indicating the most significant concepts of the present disclosure are described as further improvements of said elements.

Further, for ease of understanding of the present disclosure, the scale of elements shown in each of the drawings referred to in the above embodiments may be different from actual scale. Further, embodiments of the present disclosure are not limited by the description of the above embodiments and may be modified without departing from the spirit and scope of embodiments of the present disclosure.

Further, circuitry and members such as lead wires are present on the substrate in the portable wireless device. However, with respect to electrical wiring and electrical circuits, a variety of functions may be implemented based on ordinary knowledge in the technical fields of portable wireless terminals, etc. Such functions have no direct relevance to description of embodiments of the present disclosure, and description thereof is omitted as a result. Note that each drawing indicated above is a schematic diagram, and embodiments of the present disclosure need not be exactly as depicted.

<<Summary>>

As described above, the portable communication device pertaining to one aspect of the present disclosure is a portable communication device comprising: a housing; a substrate disposed within the housing and including a wireless communication circuit; and a sealing member configured to prevent entry of water into the substrate from the outside of the housing, wherein the sealing member includes an insulative base body, and an electrically conductive layer covering a portion of a surface of the base body, wherein the electrically conductive layer is connected to an antenna terminal of the wireless communication circuit and serves as an antenna element. According to this configuration, a high degree of waterproofing is obtained and a reduction in size is achieved by configuring the antenna elements in the sealing member.

Further, the electrically conductive layer may include metal material, and may have been formed by vapor deposition or plating. According to this configuration, patterning of a region to be targeted for deposition of the electrically conductive layer is easily achieved by masking a portion of the surface of the sealing member.

Further, the wireless communication circuit may include a plurality of antenna terminals, and the electrically conductive layer may include a first electrically conductive layer and a second electrically conductive layer that are not electrically connected with each other, the first electrically conductive layer being electrically connected to one of the plurality of antenna terminals, and the second electrically conductive layer being electrically connected to another one of the plurality of antenna terminals. According to this configuration, the first electrically conductive layer and the second electrically conductive layer function as antenna elements of the wireless communication circuit, and a reduction in size is achieved by configuring the antenna elements in the sealing member.

Further, the wireless communication circuit may include a first wireless communicator and a second wireless communicator each using a different communication scheme, and the first electrically conductive layer and the second electrically conductive layer may be electrically connected to the first wireless communicator and the second wireless communicator, respectively. Further, the first wireless communicator may be a GPS receiver circuit, and the second wireless communicator may be a Bluetooth circuit. According to this configuration, the sealing member is provided with two or more functions out of the functions as antenna elements that the portable communication device is required to have and size of the housing is further reduced.

Further, the housing may include a first housing member and a second housing member that are jointed together at peripheries thereof, said peripheries each having a loop-like shape, and the sealing member may include a loop-shaped portion extending along said peripheries of the first housing member and the second housing member, and the loop-shaped portion may be disposed between the first housing member and the second housing member. According to this configuration, in a housing configuration having first housing member and a second housing member jointed together via a loop-shaped joining region, a high degree of waterproofing is achieved and further reduction in size is achieved by configuring the antenna elements in the sealing member.

Further, the electrically conductive layer may be disposed on a surface of the loop-shaped portion of the sealing member that faces toward the inside of the housing. According to this configuration, the possibility of the electrically conductive layer being exposed to water is reduced and the electrically conductive layer is prevented from losing functionality as an antenna element even when an outer surface of the housing gets wet. Further, corrosion of the electrically conductive layer is prevented.

Further, a cross-section of the sealing member perpendicular to the direction along the loop-shaped portion may have the shape of a rectangle whose long sides extend along the thickness direction of the housing. According to this configuration, by reducing the width of the sealing member, the width of the housing is reduced and thereby size of the housing is reduced while ensuring satisfactory waterproofing.

Further, the sealing member may include an extending portion that protrudes toward the inside of the housing from the loop-shaped portion, and a portion of the electrically conductive layer may be pressed against one of the plurality of antenna terminals, the portion of the electrically conductive layer being on the extending portion. According to this configuration, the electrically conductive layer and the wireless communication circuit are connected by a simple configuration, and the electrically conductive layer functions as an antenna element.

Further, the sealing member may be sheet-shaped. According to this configuration, the electrically conductive layer is achieved by easily performing patterning with a high degree of freedom using the planar portion of the sealing member, and a reduction in size of the housing is achieved.

Further, the sealing member may be positioned to face the substrate, with the electrically conductive layer facing, among spaces within the housing separated by the sealing member, a space in which the substrate is located, and a portion of the electrically conductive layer may be pressed against one of the plurality of antenna terminals. According to this configuration, water that enters the housing is prevented from penetrating as far as the substrate.

Further, the electrically conductive layer may include any of Au, Ag, Al, Cu, and Zn, any of alloys of Au, Ag, Al, Cu, and Zn, or any combination thereof. Further, the electrically conductive layer may have a thickness of 30 μm to 100 μm. According to this configuration, the electrically conductive layer functioning as an antenna element having sufficient electrical conductivity.

Further, in another aspect of the present disclosure, the sealing member may have a third electrically conductive layer covering a portion of a surface of the base body, wherein the third electrically conductive layer is not connected to an antenna terminal of the wireless communication circuit. According to this configuration, the third electrically conductive layer functions as a passive element.

Embodiments of the present disclosure have the advantageous effects of achieving downsizing while achieving a high degree of waterproofing without loss of antenna function, and are applicable to portable communication terminals, etc.

The invention claimed is:

1. A portable communication device comprising:
a housing, wherein the housing includes a first housing member and a second housing member that are joined together at peripheries thereof, said peripheries each having a loop-like shape;
a substrate disposed within the housing and including a wireless communication circuit; and
a sealing member configured to prevent entry of water into the substrate from the outside of the housing, wherein the sealing member includes a loop-shaped portion extending along said peripheries of the first housing member and the second housing member, and the loop-shaped portion is disposed between the first housing member and the second housing member, wherein the sealing member includes an insulative base body, and an electrically conductive layer covering and directly formed on a portion of a surface of the base body, wherein the electrically conductive layer is connected to an antenna terminal of the wireless communication circuit and serves as an antenna element.

2. The portable communication device of claim 1, wherein the electrically conductive layer includes metal material, and has been formed by vapor deposition or plating.

3. The portable communication device of claim 2, wherein the wireless communication circuit includes a plurality of antenna terminals, and the electrically conductive layer includes a first electrically conductive layer and a second electrically conductive layer that are not electrically connected with each other, the first electrically conductive layer is electrically connected to one of the plurality of antenna terminals, and the second electrically conductive layer is electrically connected to another one of the plurality of antenna terminals.

4. The portable communication device of claim 3, wherein the wireless communication circuit includes a first wireless communicator and a second wireless communicator each using a different communication scheme, and the first electrically conductive layer and the second electrically conductive layer are electrically connected to the first wireless communicator and the second wireless communicator, respectively.

5. The portable communication device of claim 4, wherein the first wireless communicator is a GPS receiver circuit, and the second wireless communicator is a short range wireless communication circuit.

6. The portable communication device of claim 1, wherein the electrically conductive layer is disposed on a surface of the loop-shaped portion of the sealing member that faces toward the inside of the housing.

7. The portable communication device of claim 3, wherein a cross-section of the sealing member perpendicular to the direction along the loop-shaped portion has the shape of a rectangle whose long sides extend along the thickness direction of the housing.

8. The portable communication device of claim 3, wherein the sealing member includes an extending portion that protrudes toward the inside of the housing from the loop-shaped portion, and a portion of the electrically conductive layer is pressed against one of the plurality of antenna terminals, the portion of the electrically conductive layer being on the extending portion.

9. The portable communication device of claim 1, wherein the sealing member is sheet-shaped.

10. The portable communication terminal of claim 9, wherein the sealing member is positioned to face the substrate, with the electrically conductive layer facing, among spaces within the housing separated by the sealing member, a space in which the substrate is located, and at least a portion of the electrically conductive layer is pressed against one of the plurality of antenna terminals.

11. The portable communication device of claim 1, wherein the electrically conductive layer includes any of Au, Ag, Al, Cu, and Zn, any of alloys of Au, Ag, Al, Cu, and Zn, or any combination thereof.

12. The portable communication device of claim 1, wherein the electrically conductive layer has a thickness of 30 μm to 100 μm.

13. The portable communication device of claim 1, wherein the electrically conductive layer is formed by one of sputtering, ion plating, printing, and metal foil adhesion.

14. The portable communication device of claim 6, wherein the second housing member comprises an interior groove into which the loop-shaped portion of the sealing member is inserted, and wherein the interior groove has a larger width in a portion of the interior groove in which the portion of the surface of the base body covered by the electrically conductive layer is inserted, than in a portion of the interior groove in which a portion of the surface of the base body that is not covered by the electrically conductive layer is inserted.

15. The portable communication device of claim 7, wherein the electrically conductive layer covers an entirety of the surface of the loop-shaped portion of the sealing member that faces towards the inside of the housing.

* * * * *